(12) United States Patent
Isayama

(10) Patent No.: US 11,845,575 B2
(45) Date of Patent: Dec. 19, 2023

(54) DOCKING DEVICE

(71) Applicant: IHI AEROSPACE CO., LTD., Tokyo (JP)

(72) Inventor: Michio Isayama, Tokyo (JP)

(73) Assignee: IHI AEROSPACE CO., LTD., Tokyo (JP)

( * ) Notice: Subject to any disclaimer, the term of this patent is extended or adjusted under 35 U.S.C. 154(b) by 606 days.

(21) Appl. No.: 16/482,627

(22) PCT Filed: Feb. 23, 2018

(86) PCT No.: PCT/JP2018/006765
§ 371 (c)(1),
(2) Date: Jul. 31, 2019

(87) PCT Pub. No.: WO2018/180086
PCT Pub. Date: Oct. 4, 2018

(65) Prior Publication Data
US 2020/0024011 A1   Jan. 23, 2020

(30) Foreign Application Priority Data

Mar. 31, 2017   (JP) ................................. 2017-071259

(51) Int. Cl.
*B64G 1/64* (2006.01)
*H03K 17/687* (2006.01)
(52) U.S. Cl.
CPC ................ *B64G 1/646* (2013.01); *B64G 1/64* (2013.01); *H03K 17/6871* (2013.01)
(58) Field of Classification Search
CPC ....... B64G 1/646; B64G 1/64; H03K 17/6871
See application file for complete search history.

(56) References Cited

U.S. PATENT DOCUMENTS 5,364,046 A   11/1994   Dobbs et al.
6,354,540 B1   3/2002   Lewis et al.
(Continued)

FOREIGN PATENT DOCUMENTS

CN   102923318 B   5/2015
CN   106240849 A   12/2016
(Continued)

OTHER PUBLICATIONS

English Translation of International Search Report for PCT/JP2018/006765, dated May 22, 2018, 2 pages.
(Continued)

*Primary Examiner* — Andrew Schechter
*Assistant Examiner* — Jeremy A Delozier
(74) *Attorney, Agent, or Firm* — SEED INTELLECTUAL PROPERTY LAW GROUP LLP

(57) ABSTRACT

A docking device including: a base ring disposed in a first space vehicle; a first-side capturing ring for coming into contact with the second space vehicle; six links that constitute a parallel link mechanism for coupling the base ring to the first-side capturing ring; and linear actuators, each of which extends and contracts the link by using a motor as a driving source, wherein resistance generation mechanisms, each of which generates a regenerative current in the motor of the linear actuator to produce resistance force when the second space vehicle comes into contact with the first-side capturing ring and the link receives a compressive load, are provided. Correction of misalignment with the second space vehicle, and attenuation of inertia force that the second space vehicle has can be performed without requiring complicated electrical control, and simplification and cost reduction of an electrical system can be implemented.

4 Claims, 5 Drawing Sheets

(56) References Cited

U.S. PATENT DOCUMENTS

| | | | |
|---|---|---|---|
| 2015/0266595 A1 | 9/2015 | Ghofranian et al. | |
| 2016/0301339 A1* | 10/2016 | Ito | H02K 21/24 |
| 2017/0015443 A1* | 1/2017 | Lakshmanan | B64G 1/646 |
| 2018/0297723 A1* | 10/2018 | Sorensen | B64G 1/64 |
| 2019/0023422 A1* | 1/2019 | Nicholson | B64G 1/402 |
| 2020/0102102 A1 | 4/2020 | Liu et al. | |

FOREIGN PATENT DOCUMENTS

| | | |
|---|---|---|
| JP | H05-330500 A | 12/1993 |
| JP | H08-251947 A | 9/1996 |
| JP | 2001-260997 A | 9/2001 |
| JP | 2004-350388 A | 12/2004 |
| JP | 2016-222191 A | 12/2016 |
| JP | 2017-508671 A | 3/2017 |

OTHER PUBLICATIONS

European Search Report for EP 18775284.5, dated Dec. 11, 2020, 5 pages.

* cited by examiner

DOCKING DEVICE

TECHNICAL FIELD

Embodiments described herein relate to a docking device used for docking of a first space vehicle that performs inertial flight in space with a second space vehicle that performs inertial flight in space.

BACKGROUND ART

Conventionally, as the aforementioned docking device, a docking device disclosed in Patent Document 1 is known, for example.

This docking device is used for docking of a manned space vehicle, and comprises a base ring disposed in a docking part of a first space vehicle that performs inertial flight in space, a capturing ring that includes a load sensor, and comes into contact with a second space vehicle that performs inertial flight in space, and a parallel link mechanism that couples the base ring and the capturing ring with six degrees of freedom, and this parallel link mechanism is composed of six links that are extended and contracted by motor-driven linear actuators.

In this docking device, extension and contraction of each of the linear actuators at the six links is electrically controlled in accordance with a load by contact with the second space vehicle, the load being measured by the load sensor of the capturing ring, so that misalignment (decentering) with respect to the second space vehicle is corrected, and inertia force which the second space vehicle has is attenuated.

RELATED ART DOCUMENT

Patent Document

Patent Document 1: U.S. Pat. No. 6,354,540B1

SUMMARY OF THE DISCLOSURE

Problems to be Solved by the Disclosure

In the aforementioned docking device, at the time of docking with the second space vehicle, while the correction of the misalignment, and the attenuation of the inertia force that the second space vehicle has can be performed, the electrical control of the linear actuators becomes extremely complicated logic because the contact load with the second space vehicle is fed back, and the respective linear actuators at the six links are extended and contracted.

Therefore, there is a problem that the scale of an electrical system is increased, and cost is increased, and solving this problem is a conventional problem.

The present disclosure has been made in view of the aforementioned conventional problem, and an object of the present disclosure is to provide a docking device in which at the time of docking, misalignment with the other-side space vehicle can be corrected, and inertia force that the other-side space vehicle has can be attenuated, and, in addition, simplification and cost reduction of an electrical system can be achieved.

Means for Solving the Problems

The present disclosure is a docking device that is mounted on a first space vehicle that performs inertial flight in space, and docks, with the first space vehicle, a second space vehicle that performs inertial flight in space, the docking device comprising: a base ring disposed in a coupling part of the first space vehicle; a first-side capturing ring for coming into contact with the second space vehicle; six links that constitute a parallel link mechanism for coupling the base ring to the first-side capturing ring with six degrees of freedom; and linear actuators, each of which incorporates a motor as a driving source, and extends and contracts the link, wherein resistance generation mechanisms, each of which generates a regenerative current in the motor of the linear actuator to produce resistance force with respect to at least a compressive load when the second space vehicle comes into contact with the first-side capturing ring and the link receives a contact load, are provided.

Effects of the Disclosure

In the docking device according to the present disclosure, correction of misalignment with a second space vehicle, and attenuation of inertia force that the second space vehicle has can be performed without requiring complicated electrical control of linear actuators, and therefore a very excellent effect that simplification and cost reduction of an electrical system can be implemented is obtained.

MODE FOR CARRYING OUT THE DISCLOSURE

Hereinafter, an embodiment of the present disclosure will be described with reference to the drawings.

Figure 1:
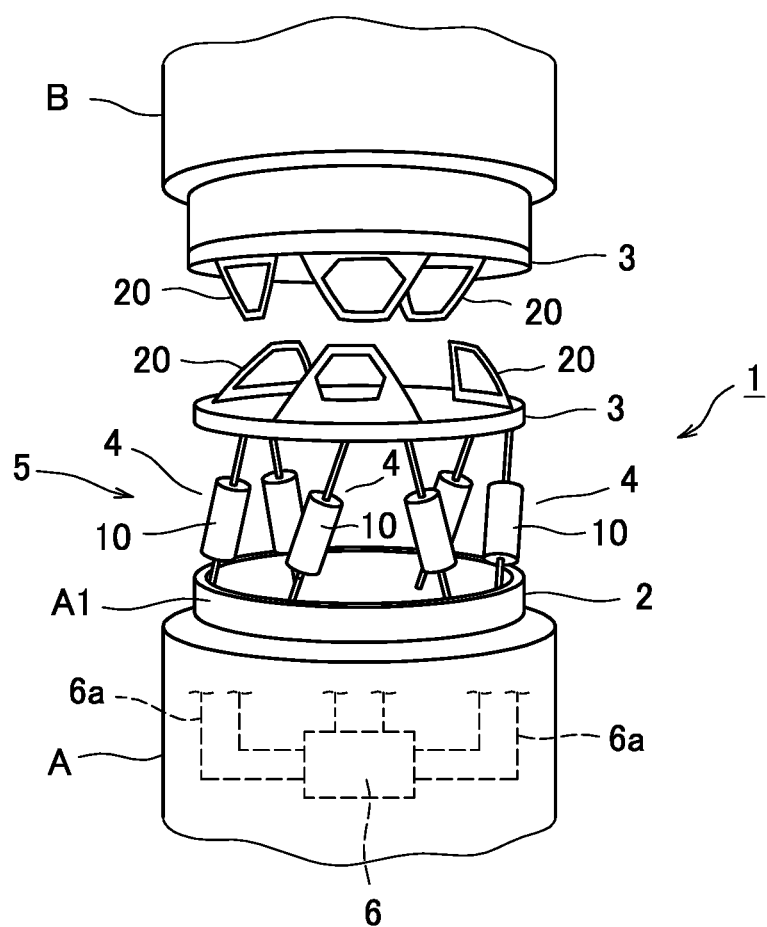
FIG. 1 is a perspective explanatory view illustrating a state just before docking of a docking device according to an embodiment of the present disclosure.
Figure 2A:
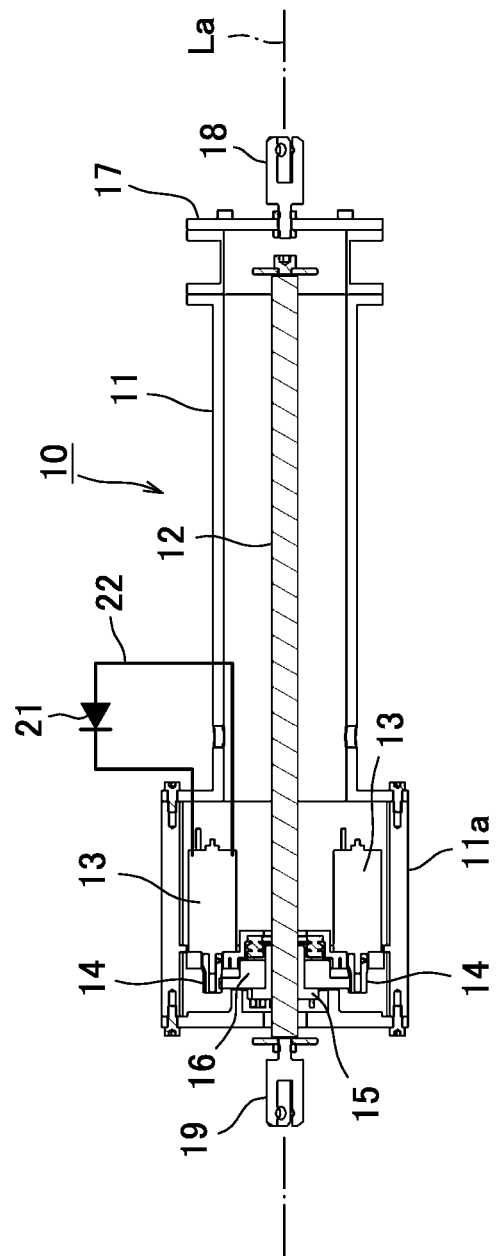
FIG. 2A is an enlarged sectional explanatory view of a screwed-in state of a linear actuator in the docking device illustrated in FIG. 1.
Figure 2B:
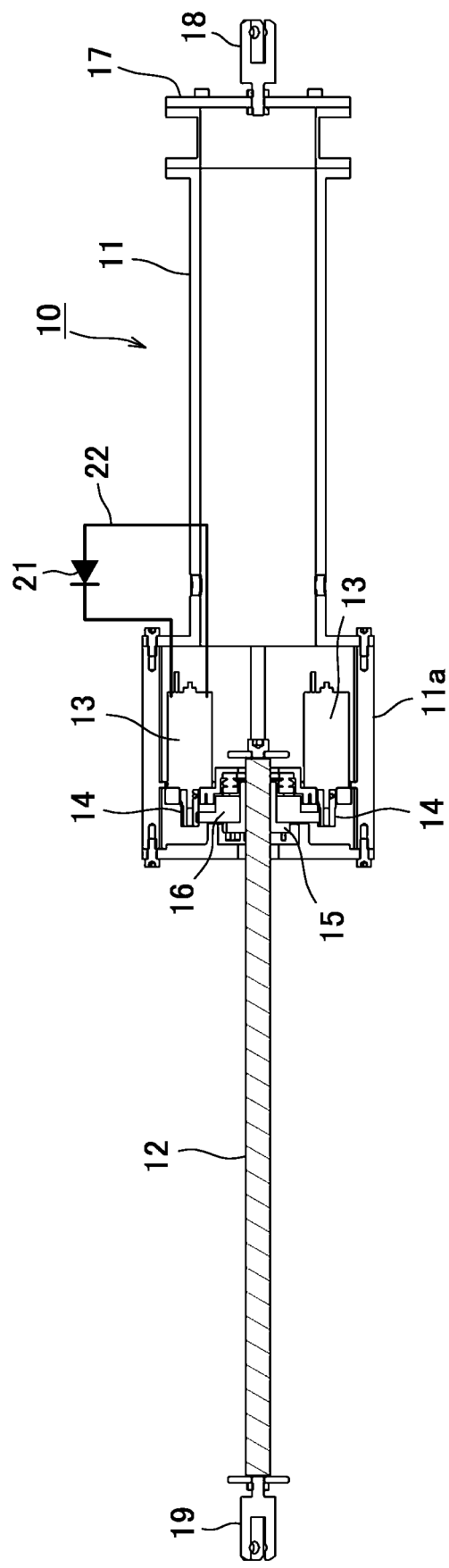
FIG. 2B is an enlarged sectional explanatory view of a screwed-out state of the linear actuator in the docking device illustrated in FIG. 1.

FIG. 1, FIG. 2A, and FIG. 2B each illustrate a docking device according to an embodiment of the present disclosure.

As illustrated in FIG. 1, a docking device 1 mounted on a first space vehicle A that performs inertial flight in space comprises a base ring 2 disposed in a coupling part A1 of this space vehicle A, a first-side capturing ring 3 that includes a load sensor (not illustrated), and comes into contact with a second space vehicle B that performs inertial flight in space at the time of docking, and a parallel link mechanism 5 that is composed of six links 4 extended and contracted by linear actuators 10, and couples the base ring 2 and the first-side capturing ring 3 with six degrees of freedom.

As illustrated in FIG. 2A, the linear actuators 10 each comprise a cylinder 11, a sliding screw 12 that is located on a shaft center La of this cylinder 11 and having almost the same length as the cylinder 11, two motors 13, 13 that are housed in a large-diameter part 11a located at one end (left end in the drawing) side of the cylinder 11, and are disposed with the sliding screw 12 therebetween, pinions 14, 14 mounted on respective output shafts of these motors 13, 13, a nut 15 that is screwed with the sliding screw 12 in a state in which movement in the direction of the shaft center La is restricted in the large-diameter part 11a of the cylinder 11, and a gear 16 that is coaxially fixed to this nut 15, and is meshed with the pinions 14, 14. A coupling tool 18 for the base ring 2 is disposed in an end cover 17 located at the other end (right end in the drawing) of the cylinder 11, and a coupling tool 19 for the first-side capturing ring 3 is disposed at an end of the sliding screw 12.

In this linear actuator 10, output of the two motors 13, 13 is transmitted to the nut 15 through the pinions 14, 14, and the gear 16 meshed with the pinions, so that the sliding screw 12 is operated in a range from a screwed-in state illustrated in FIG. 2A to a screwed-out state illustrated in FIG. 2B, that is, extending and contracting operation is performed.

This docking device 1 comprises resistance generation mechanisms, each of which generates a regenerative current in the motors 13, 13 of the linear actuator 10 to produce resistance force with respect to a compressive load when the second space vehicle B comes into contact with the first-side capturing ring 3, and the links 4 of the parallel link mechanism 5 each receive a contact load.

In this embodiment, each resistance generation mechanism comprises the aforementioned sliding screw 12 that rotates in such a direction that axial force of the link 4 is relaxed, and reciprocates in the axial direction of the link 4 when the link 4 receives the contact load, and a resistance generation circuit 22 having a diode 21 electrically connected to the motor 13.

In this resistance generation mechanism, while a regenerative current is generated in the motor 13 in the resistance generation circuit 22 by rotation of the sliding screw 12 in such a direction that the link 4 contracts, and resistance force is produced with respect to a compressive load received by the link 4 of the parallel link mechanism 5, resistance force is not generated in the motor 13 with respect to a tensile load received by the link 4.

Reference numeral 20 in FIG. 1 denotes a guide, and the guides are disposed on the first-side capturing ring 3 at intervals of 120° so as to freely open and close.

In this embodiment, a second-side capturing ring 3 which is the same type as the first-side capturing ring 3 of the aforementioned docking device 1, a so-called genderless type ring is also mounted on the second space vehicle B.

In a case in which the second space vehicle B is docked with the first space vehicle A by the docking device 1 according to this embodiment described above, the second space vehicle B, which is a docking partner, first comes into contact with the first-side capturing ring 3. Then, when the links 4 of the parallel link mechanism 5 receive compressive load, the sliding screw 12 of each resistance generation mechanism rotates in such a direction that the link 4 contracts, a regenerative current is generated in the motor 13 in the resistance generation circuit 22, and resistance force (axial force) is generated.

With respect to a tensile load received by each of the links 4 of the parallel link mechanism 5, resistance force by each resistance generation circuit 22 is not generated, even when the sliding screw 12 of each resistance generation mechanism rotates in such a direction that the link 4 extends.

That is, in a case in which each link 4 receives a load in such a direction that the linear actuator 10 contracts, large resistance force is generated, and therefore correction of misalignment with the second space vehicle B, and attenuation of inertia force that the second space vehicle B has are attained without requiring electrical control of the linear actuators 10.

Therefore, the electrical control of the linear actuators 10 becomes simple logic, and simplification and cost reduction of an electrical system can be achieved.

Thus, the resistance generation mechanisms of the docking device 1 according to this embodiment can correct misalignment with the second space vehicle B and attenuate inertia force that the second space vehicle B has, without requiring electrical control, and therefore in a case in which a controller 6 that is connected to the linear actuators 10 of the six links 4 through lead wires 6a (illustrated halfway) as illustrated by broken lines in FIG. 1, and that electrically controls the linear actuators 10 of the six links 4 is provided, the resistance generation mechanisms can be used as backup of this electrical system.

In addition, in the docking device 1 according to this embodiment, when resistance torque generated in each motor 13 is converted into axial force of the link 4, the resistance torque is amplified by friction of a flank of the sliding screw 12 in each resistance generation mechanism, and therefore larger resistance force of each linear actuator 10 is obtained compared to resistance force output by each motor 13.

In the docking device 1 according to this embodiment, the resistance generation circuit 22 having the diode 21 electrically connected to each motor 13 is used as the resistance generation circuit of the resistance generation mechanism, but the resistance generation circuit is not limited to this.

Figure 3:
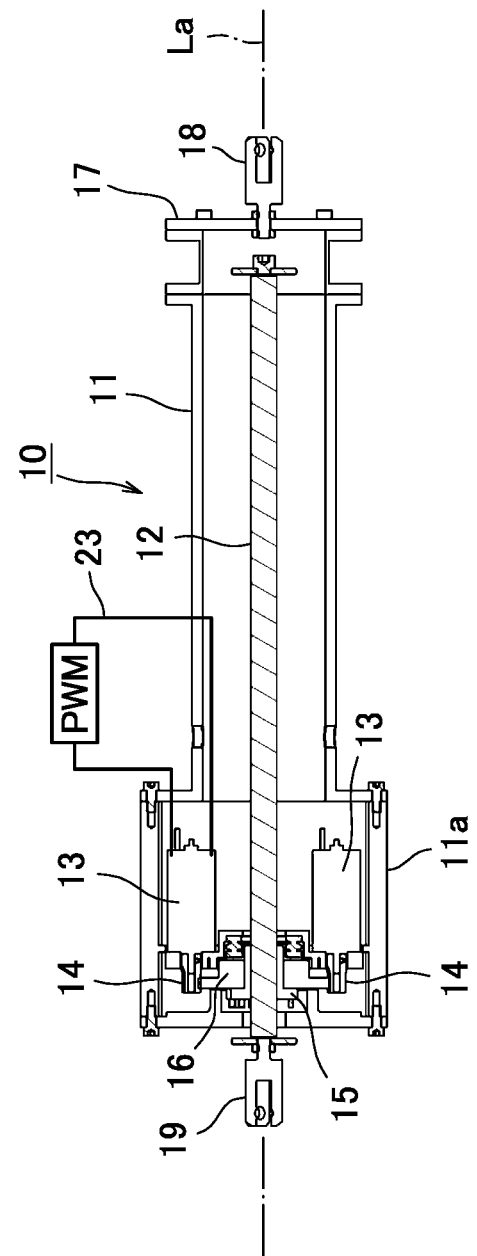
FIG. 3 is an enlarged sectional explanatory view of a screwed-in state of a linear actuator in a docking device according to another embodiment of the present disclosure.

As another configuration, for example, in a case in which the controller 6 that electrically controls the linear actuators 10 of the six links 4, illustrated by the broken lines in FIG. 1, is provided, a PWM (Pulse Width Modulation) control circuit 23 that controls, by pulse width modulation, a regenerative current generated in each motor 13 by rotation of the sliding screw 12 in such a direction that axial force is relaxed with respect to a contact load received by each linear actuator 10 (link 4), as illustrated in FIG. 3 may be used as the resistance generation circuit of the resistance generation mechanism.

In this docking device 1, when the second space vehicle B which is a docking partner comes into contact with the first-side capturing ring 3, a regenerative current generated in each motor 13 by rotation of the sliding screw 12 in such a direction that the axial force of the link 4 is relaxed with respect to a contact load received by the link 4 of the parallel link mechanism 5 is controlled by pulse width modulation of the PWM control circuit 23.

That is, resistance force of each of the linear actuators 10 electrically controlled by the controller 6 is actively controlled by the PWM control circuit 23 (a current flows only when power pulse is in an ON state), and therefore electrical control of the linear actuator 10, which conventionally requires a large current, can be performed only by a minute current for each PWM control circuit 23, and more precise alignment control and damping force control can be performed, in addition to power reduction of the electrical system and weight reduction of a wire harness.

Figure 4:
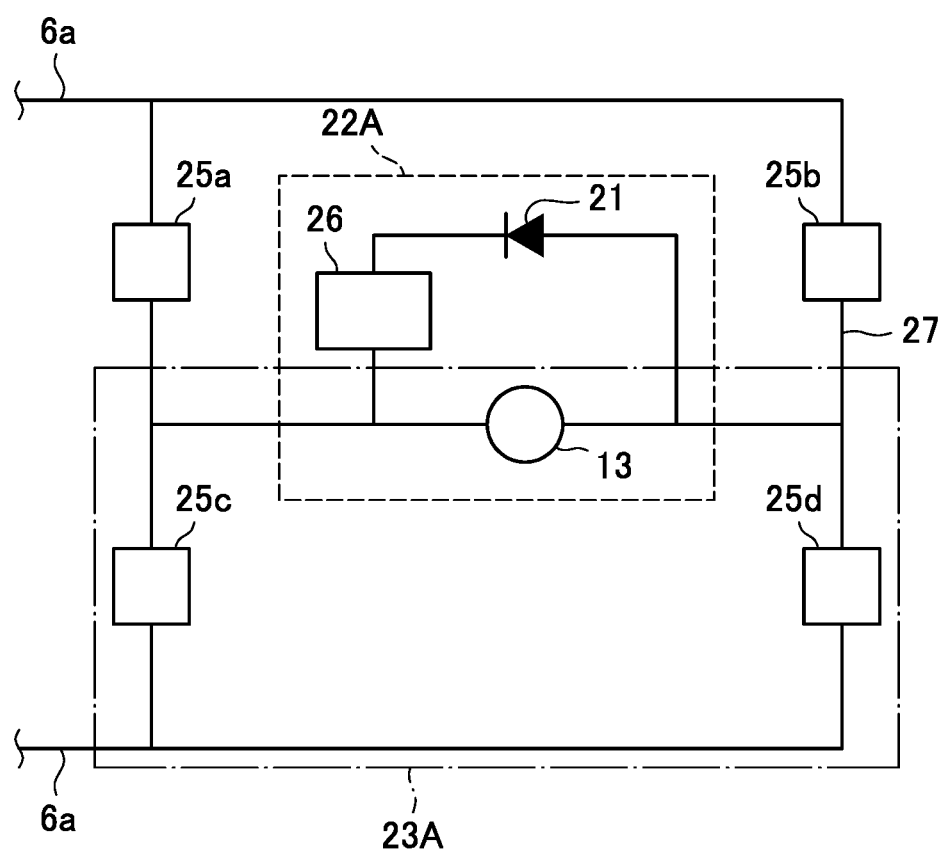
FIG. 4 is a circuit explanatory view illustrating a bridge circuit of a resistance generation mechanism in a docking device according to still another embodiment of the present disclosure.

Furthermore, as another configuration, for example, in a case in which the controller 6 that electrically controls the linear actuators 10 of the six links 4, illustrated by the broken lines in FIG. 1, is provided, a bridge circuit 27 including the motor 13 of each of the linear actuators 10 electrically controlled by the controller 6, and four FETs (Field Effect Transistor) 25a to 25d is constructed, and a resistance generation circuit 22A and a PWM control circuit 23A used by selective opening and closing of a gate of each of the four FETs 25a to 25d may be included in this bridge circuit 27, as illustrated in FIG. 4.

In this case, a relay 26 is connected to the resistance generation circuit 22A in addition to the diode 21 electrically connected to the motor 13.

Both the resistance generation circuit 22A and the PWM control circuit 23A may be included in the bridge circuit 27 like this embodiment, or any one of these may be included.

In this embodiment, in a case in which the gates of all the FETs 25a to 25d of the four FETs 25a to 25d are closed, and the relay 26 inside the resistance generation circuit 22A is closed, a regenerative current generated in the motor 13 inside the resistance generation circuit 22A by rotation of the sliding screw 12 in such a direction that the link 4 contracts flows only in the forward direction of the diode 21, and resistance force is generated with respect to a compressive load received by the link 4 of the parallel link mechanism 5, and resistance force is not generated in the motor 13 with respect to a tensile load received by the link 4.

In this embodiment, in a case in which the gates of the FETs 25a, 25b of the four FETs 25a to 25d are closed, and the relay 26 inside the resistance generation circuit 22A is opened, a regenerative current generated in the motor 13 by rotation of the sliding screw 12 in such a direction that axial force of the link 4 is relaxed, with respect to a contact load received by the link 4 is PWM-controlled by the FETs 25c, 25d (PWM control circuit 23A) of the four FETs 25a to 25d.

In this embodiment, the relay 26 inside the resistance generation circuit 22A is opened, and then all the four FETs 25a to 25d of the bridge circuit 27 are used, so that control of the motor 13 of the linear actuator 10 by the controller 6 is performed.

That is, also in this embodiment, the gates of all the FETs 25a to 25d of the four FETs 25a to 25d are closed, and the relay 26 inside the resistance generation circuit 22A is closed, so that correction of misalignment with the second space vehicle B, and attenuation of inertia force that the second space vehicle B has can be performed without requiring electrical control.

In addition, also in this embodiment, the gates of the FETs 25a, 25b of the four FETs 25a to 25d are closed, and the relay 26 inside the resistance generation circuit 22A is opened, so that electrical control of the linear actuator 10, which conventionally requires a large current, can be performed only by a minute current for each PWM control circuit 23A.

The configuration of the docking device according to the present disclosure is not limited to the configurations of the aforementioned embodiments.

A first aspect of the present disclosure is a docking device that is mounted on a first space vehicle that performs inertial flight in space, and docks, with the first space vehicle, a second space vehicle that performs inertial flight in space, the docking device comprising: a base ring disposed in a coupling part of the first space vehicle; a first-side capturing ring for coming into contact with the second space vehicle; six links that constitute a parallel link mechanism for coupling the base ring to the first-side capturing ring with six degrees of freedom; and linear actuators, each of which incorporates a motor as a driving source, and extends and contracts the link, wherein resistance generation mechanisms, each of which generates a regenerative current in the motor of the linear actuator to produce resistance force with respect to at least a compressive load when the second space vehicle comes into contact with the first-side capturing ring and the link receives a contact load, are provided.

In a second aspect of the present disclosure, each of the resistance generation mechanisms comprises a sliding screw which rotates by output of the motor of the linear actuator, and reciprocates in an axial direction of the link, and which rotates in such a direction that axial force of the link is relaxed, and reciprocates in the axial direction of the link when the link receives a contact load, and a resistance generation circuit which generates a regenerative current in the motor by rotation of the sliding screw in such a direction that the link contracts, and produces resistance force with respect to the compressive load received by the link, and which does not produce resistance force in the motor with respect to a tensile load received by the link.

Furthermore, a third aspect of the present disclosure further comprising a controller that electrically controls operation of the motors of the linear actuators, wherein each of the resistance generation mechanisms includes a sliding screw which rotates by output of the motor of the linear actuator electrically controlled by the controller, and reciprocates in an axial direction of the link, and which rotates in such a direction that axial force of the link is relaxed, and reciprocates in the axial direction of the link, when the link receives a contact load, and a PWM control circuit which controls, by pulse width modulation, a regenerative current generated in the motor by rotation of the sliding screw in such a direction that axial force of the link is relaxed with respect to a contact load received by the link.

Furthermore, a fourth aspect of the present disclosure further comprising a controller that electrically controls operation of the motors of the linear actuators, wherein each of the resistance generation mechanisms includes a bridge circuit including the motor of the linear actuator electrically controlled by the controller, and four FETs, and each of the bridge circuits includes the resistance generation circuit used by selective opening and closing of a gate of each of the four FETs.

Furthermore, in a fifth aspect of the present disclosure, each of the resistance generation mechanisms comprises a bridge circuit including the motor of the linear actuator electrically controlled by the controller, and four FETs, and each of the bridge circuits includes the PWM control circuit used by selective opening and closing of a gate of each of the four FETs.

The docking device according to the present disclosure is mounted on the first space vehicle that performs inertial flight in space, and a capturing ring which is the same type as the capturing ring of the docking device according to the present disclosure, a so-called genderless type ring is also mounted on the second space vehicle that is a partner and is coupled to this first space vehicle.

In the docking device according to the first aspect of the present disclosure, when the second space vehicle, which is a docking partner, comes into contact with the first-side capturing ring, and the links each receive a contact load, at least a compressive load, each resistance generation mechanism generates a regenerative current in the motor of the linear actuator to produce resistance force (axial force) in the link.

That is, in a case in which each link receives a load in such a direction that the linear actuator contracts, large resistance force is generated, and therefore correction of misalignment with the second space vehicle, and attenuation of inertia force that the second space vehicle has are attained without requiring complicated electrical control of the linear actuators.

Therefore, the electrical control of the linear actuators becomes simple logic, and simplification and cost reduction of an electrical system is achieved.

In the docking device according to the second aspect of the present disclosure, when the second space vehicle that is a docking partner comes into contact with the first-side capturing ring, the sliding screw of each resistance generation mechanism rotates in such a direction that the link contracts, and a regenerative current is generated in the motor inside the resistance generation circuit, and resistance force is produced, with respect to the compressive load received by the link.

With respect to the tensile load received by each of the link, resistance force by each resistance generation circuit is not generated, even when the sliding screw 12 of each resistance generation mechanism rotates in such a direction that the link extends. That is, correction of misalignment with the second space vehicle, and attenuation of inertia force that the second space vehicle has are attained without requiring electrical control of the linear actuators.

Thus, each resistance generation mechanism of the docking device according to the second aspect of the present disclosure does not require the electrical control of the linear actuators, and therefore can be used also as backup of a conventional electrical system (a preventive means for collision accident in a case in which electrical control of the linear actuators is not performed).

In addition, when resistance torque generated in each motor is converted into axial force of the link, the resistance torque is amplified by friction of a flank of the sliding screw in each resistance generation mechanism, and therefore resistance force of each linear actuator which is larger than resistance force output by each motor is obtained.

Furthermore, in the docking device according to the third aspect of the present disclosure, when the second space vehicle that is a docking partner comes into contact with the first-side capturing ring, a regenerative current generated in each motor by rotation of the sliding screw in such a direction that the axial force of the link is relaxed with respect to a contact load received by each of the links is controlled by pulse width modulation of the PWM control circuit.

That is, resistance force of each of the linear actuators electrically controlled by the controller is actively controlled by the PWM control circuit, and therefore electrical control of the linear actuator, which conventionally requires a large current, can be performed only by a minute current for each PWM control circuit, and more precise alignment control and damping force control can be performed, in addition to power reduction of the electrical system and weight reduction of a wire harness.

Furthermore, in the docking device according to the fourth aspect of the present disclosure, the gates of all the FETs of the four FETs are closed, so that correction of misalignment with the second space vehicle, and attenuation of inertia force that the second space vehicle has can be performed without requiring electrical control, similarly to the docking device according to the second aspect of the present disclosure.

Furthermore, in the docking device according to the fifth aspect of the present disclosure, the gates of the two FETs of the four FETs are selectively closed, so that electrical control of the linear actuator, which conventionally requires a large current, can be performed only by a minute current for each PWM control circuit.

In the docking device according to the first aspect of the present disclosure, correction of misalignment with the second space vehicle, and attenuation of inertia force that the second space vehicle has can be performed without requiring complicated electrical control of the linear actuators, and therefore a very excellent effect that simplification and cost reduction of an electrical system can be implemented is obtained.

In the docking device according to the second aspect of the present disclosure, correction of misalignment with the second space vehicle, and attenuation of inertia force that the second space vehicle has can be performed without requiring electrical control of the linear actuators, and therefore further cost reduction can be implemented, and the docking device can be used as backup of a conventional electrical system.

In the docking device according to the third aspect of the present disclosure, electrical control of each linear actuator can be performed only by a minute current for the PWM control circuit, and therefore a very excellent effect that more precise alignment control and damping force control can be performed while power reduction of the electrical system and weight reduction of a wire harness can be implemented is obtained.

In the docking device according to the fourth aspect of the present disclosure, all the four FETs of each bridge circuit are used, so that the motor of the linear actuator can be controlled by the controller, and the gates of all the FETs of the four FETs are closed, so that correction of misalignment with the second space vehicle, and attenuation of inertia force that the second space vehicle has can be performed without requiring electrical control of the linear actuators.

In the docking device according to the fifth aspect of the present disclosure, all the four FETs of each bridge circuit are used, so that the motor of the linear actuator can be controlled by the controller, and the gates of the two FETs of the four FETs are closed, so that electrical control of the linear actuator, which conventionally requires a large current, can be performed only by a minute current for each PWM control circuit.

EXPLANATION OF REFERENCE SIGNS 1 docking device
2 base ring
3 first-side capturing ring
4 link
5 parallel link mechanism
6 controller
10 linear actuator
12 sliding screw (resistance generation mechanism)
13 motor
22, 22A resistance generation circuit (resistance generation mechanism)
23, 23A PWM control circuit (resistance generation mechanism)
25a to 25d FET
A first space vehicle
A1 coupling part of first space vehicle
B second space vehicle

The invention claimed is:

1. A docking device that is mounted on a first space vehicle that performs inertial flight in space, and docks, with the first space vehicle, a second space vehicle that performs inertial flight in space, the docking device comprising:
   a base ring disposed in a coupling part of the first space vehicle;
   a first-side capturing ring for coming into contact with the second space vehicle;

six links that constitute a parallel link mechanism for coupling the base ring to the first-side capturing ring with six degrees of freedom;

linear actuators, each of which incorporates a motor as a driving source, and extends and contracts the links; and a controller that electrically controls operation of the linear actuators, wherein:

resistance generation mechanisms, each of which:

generates a regenerative current in the motor of the linear actuator to produce resistance force with respect to at least a compressive load when the second space vehicle comes into contact with the first-side capturing ring and the link receives a contact load, are provided; and comprises a sliding screw which rotates by output of the motor of the linear actuator, and reciprocates in an axial direction of the link, and which rotates in such a direction that axial force of the link is relaxed, and reciprocates in the axial direction of the link when the link receives a contact load, and a resistance generation circuit which generates a regenerative current in the motor by rotation of the sliding screw in such a direction that the link contracts, and produces resistance force with respect to the compressive load received by the link, and the resistance generation circuit comprises a diode electrically coupled to the motor, which causes the motor to not produce resistance force with respect to a tensile load received by the link;

a PWM control circuit which controls, by pulse width modulation, a regenerative current generated in the motor by rotation of the sliding screw in such a direction that axial force of the link is relaxed with respect to a contact load received by the link, and a bridge circuit including the motor of the linear actuator electrically controlled by the controller, and four FETs, and each of the bridge circuits includes the PWM control circuit used by selective opening and closing of a gate of each of the four FETs.

2. The docking device according to claim 1, further comprising:

a controller that electrically controls operation of the motors of the linear actuators, wherein:

each of the resistance generation mechanisms comprises a bridge circuit including the motor of the linear actuator electrically controlled by the controller, and four FETs, and each of the bridge circuits includes the resistance generation circuit used by selective opening and closing of a gate of each of the four FETs.

3. A docking device that is mounted on a first space vehicle that performs inertial flight in space, and docks, with the first space vehicle, a second space vehicle that performs inertial flight in space, the docking device comprising:

a base ring disposed in a coupling part of the first space vehicle;

a first-side capturing ring for coming into contact with the second space vehicle;

six links that constitute a parallel link mechanism for coupling the base ring to the first-side capturing ring with six degrees of freedom;

linear actuators, each of which incorporates a motor as a driving source, and extends and contracts the link, wherein:

resistance generation mechanisms, each of which:

generates a regenerative current in the motor of the linear actuator to produce resistance force with respect to at least a compressive load when the second space vehicle comes into contact with the first-side capturing ring and the link receives a contact load, are provided;

a controller that electrically controls operation of the motors of the linear actuators, wherein:

each of the resistance generation mechanisms comprises:

a sliding screw which rotates by output of the motor of the linear actuator electrically controlled by the controller, and reciprocates in an axial direction of the link, and which rotates in such a direction that axial force of the link is relaxed, and reciprocates in the axial direction of the link, when the link receives a contact load, and a PWM control circuit which controls, by pulse width modulation, a regenerative current generated in the motor by rotation of the sliding screw in such a direction that axial force of the link is relaxed with respect to a contact load received by the link; and a bridge circuit including the motor of the linear actuator electrically controlled by the controller, and four FETs, and each of the bridge circuits includes the PWM control circuit used by selective opening and closing of a gate of each of the four FETs.

4. A docking device that is mounted on a first space vehicle that performs inertial flight in space, and docks, with the first space vehicle, a second space vehicle that performs inertial flight in space, the docking device comprising:

a base ring disposed in a coupling part of the first space vehicle;

a first-side capturing ring for coming into contact with the second space vehicle;

six links that constitute a parallel link mechanism for coupling the base ring to the first-side capturing ring with six degrees of freedom;

linear actuators, each of which incorporates a motor as a driving source, and extends and contracts the link; and a controller that electrically controls operation of the motors of the linear actuators, wherein:

resistance generation mechanisms, each of which:

generates a regenerative current in the motor of the linear actuator to produce resistance force with respect to at least a compressive load when the second space vehicle comes into contact with the first-side capturing ring and the link receives a contact load, are provided; and comprises a sliding screw which rotates by output of the motor of the linear actuator, and reciprocates in an axial direction of the link, and which rotates in such a direction that axial force of the link is relaxed, and reciprocates in the axial direction of the link when the link receives a contact load, and a resistance generation circuit which generates a regenerative current in the motor by rotation of the sliding screw in such a direction that the link contracts, and produces resistance force with respect to the compressive load received by the link, and which does not produce resistance force in the motor with respect to a tensile load received by the link;

a PWM control circuit which controls, by pulse width modulation, a regenerative current generated in the motor by rotation of the sliding screw in such a direction that axial force of the link is relaxed with respect to a contact load received by the link;

a bridge circuit including the motor of the linear actuator electrically controlled by the controller, and four FETs, and each of the bridge circuits includes the PWM control circuit used by selective opening and closing of a gate of each of the four FETs.

\* \* \* \* \*